US006271567B1

United States Patent
Pozzoni et al.

(10) Patent No.: US 6,271,567 B1
(45) Date of Patent: Aug. 7, 2001

(54) BELOWGROUND AND OVERSUPPLY PROTECTION OF JUNCTION ISOLATED INTEGRATED CIRCUITS

(75) Inventors: Massimo Pozzoni; Paolo Cordini, both of Pavia; Domenico Rossi, Cilavegna; Giorgio Pedrazzini, Pavia; Paola Galbiati, Monza; Michele Palmieri, Bitonto; Luca Bertolini, Milan, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/227,946

(22) Filed: Jan. 11, 1999

(30) Foreign Application Priority Data

Jan. 19, 1998 (IT) .............................................. VA98A0001

(51) Int. Cl.[7] ............................. H01L 23/62; H01L 29/00
(52) U.S. Cl. .......................... 257/355; 257/500; 257/546
(58) Field of Search .................................... 257/328, 335, 257/338, 339, 362, 372, 371, 373, 357, 544, 546, 500, 501, 502, 355

(56) References Cited

U.S. PATENT DOCUMENTS 5,321,293 * 6/1994 Mojaradi et al. .................... 257/369
5,377,094 * 12/1994 Williams et al. .................... 363/132
5,420,532 * 5/1995 Teggatz et al. ...................... 327/365
5,834,826 * 11/1998 Menegoli ............................. 257/546
5,925,910 * 7/1999 Menegoli ............................. 257/335
6,060,758 * 5/2000 Ravanelli et al. ................... 257/503

* cited by examiner

*Primary Examiner*—Tom Thomas
*Assistant Examiner*—Shouxiang Hu
(74) *Attorney, Agent, or Firm*—Theodore E. Galanthay; Allen, Dyer, Doppelt Milbrath & Gilbert, P.A.

(57) ABSTRACT

In a junction isolated integrated circuit including power DMOS transistors formed in respective well regions or in an isolated epitaxial region on a substrate of opposite type of conductivity, circuits are formed in a distinct isolated region sensitive to oversupply and/or belowground effects. These effects are caused by respective power DMOS transistors coupled to the supply rail or ground. These effects are alternatively controllable by specifically shaped layout arrangements, and may be effectively protected from both effects. This is achieved by interposing between the region of sensitive circuits and the region containing the power DMOS transistors for which the alternatively implementable circuital arrangements are not formed, the region containing the power DMOS transistors coupled to the supply rail or to a ground rail for which the alternatively implementable arrangements are formed. The special interposition separates and shields the sensitive circuits from the power device whose oversupply or belowground effect is not countered by specific circuit arrangements.

23 Claims, 3 Drawing Sheets

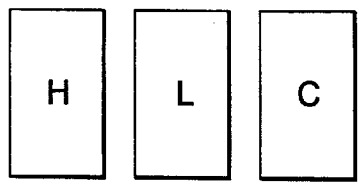
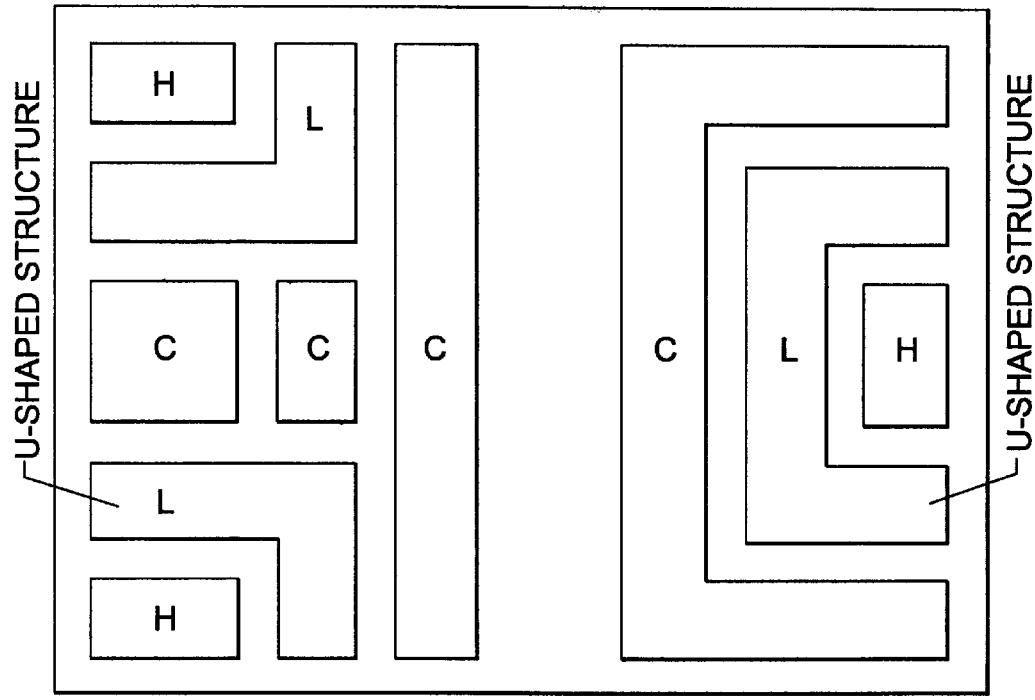
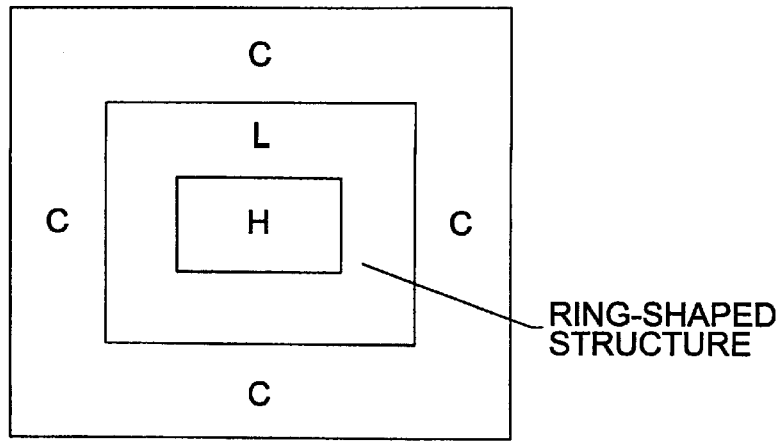

BELOWGROUND AND OVERSUPPLY PROTECTION OF JUNCTION ISOLATED INTEGRATED CIRCUITS

FIELD OF THE INVENTION

The present invention relates to the field of semiconductor devices, and, in particular, to an integrated circuit with junction isolation.

BACKGROUND OF THE INVENTION

During operation of integrated circuits with junction isolation, abnormal bias conditions may occur. Abnormal bias conditions include determination of undesired currents to the substrate and/or into active regions. These regions contain the integrated structure of the circuit components, and normally should remain isolated among each other and from the substrate by way of reverse biased p/n junctions. These abnormal bias conditions commonly occur when switching is performed for driving inductive loads, such as inductors and electric motor windings, through output transistors of the integrated circuit operating as electronic switches.

FIG. 1 shows a typical switching circuit formed with DMOS power transistors. When both transistors H and L are not conducting while a current is still flowing in the inductive load, the inductive load causes the discharge current to recirculate. This recirculation may be through the body-drain diode DBH or DBL of the transistor H or of the transistor L, depending on the direction of the discharge current. When the inductive discharge current flows through the diode DBH of the integrated transistor, a pnp parasitic transistor is conducting. The diode DBH represents the base-emitter junction, and the collector is represented by the substrate of the chip, as schematically depicted in FIG. 2. Consequently, a portion of the current is injected in the substrate. This phenomenon is commonly referred to as an oversupply, because the voltage of node A exceeds the supply VCC to allow diode DBH to conduct.

For a correct functioning of an integrated circuit with junction isolation formed either in well regions or in an n-type epitaxial layer on a p substrate, it is necessary that the substrate be biased at the lowest voltage. For example, the substrate may be biased to ground potential using surface pads or through the rear surface of the device. However, these contacts have a finite resistance and as a consequence, a current injected in the substrate may cause an increase of the substrate voltage. This phenomenon is further accentuated in proximity of the component through which the above described current recirculation occurs. Its intensity drops as the physical distance from the component increases. Therefore, there may be momentary increases of the substrate potential in the vicinity of the transistors L or H with respect to the current recirculation. The components located in the zone affected by these increments of the substrate potential may malfunction, or even undergo a breakdown condition.

When the recirculation current flows through the diode DBL, it will be divided. One portion will flow through the diode DBL itself, and the other portion will flow through the junction drain/substrate DSUB, as depicted in FIG. 3. This diode DSUB, through which part of the current flows, represents the base-emitter junction of a multicollector parasitic npn transistor, NPN par, for which any n well region or n epitaxial region on the substrate may form a collector. During this type of recirculation, referred to as belowground because the node A assumes a negative voltage, part of the recirculation current is pulled from each one of the multicollectors (n regions). The efficiency of a pulling current will be highest for the collector region closer to the area of the DMOS transistor effected by the recirculation current. This efficiency drops as the distances become increasingly larger from the device.

Known techniques for preventing the belowground effects, e.g., leaving the substrate floating, tend to worsen the effects of an oversupply phenomenon and viceversa, e.g., by ensuring a good connection to ground of the substrate. Therefore, depending on the situation, it is a common practice to provide an approach to safeguard against this phenomenon.

SUMMARY OF THE INVENTION

An object of the present invention is to provide an approach to one of the two phenomena described above while reducing worsening effects of the complementary phenomenon.

By way of illustration, characteristics of integrated circuit components and bias conditions are specifically designed to provide efficient protection against belowground effects. Within an integrated circuit layout, the circuit component, e.g., an integrated DMOS transistor L is interposed between the circuit component H from which the oversupply phenomenon has its origin, and the sensitive circuits C to be protected by the belowground and oversupplying phenomena. The belowground recirculation takes place in the integrated DMOS. These effects are efficiently addressed by the devices used in designing the integrated circuit.

The belowground and oversupply phenomena are attenuated as the distance increase. This means that the circuits C will have the component L near them, in which the conditions responsible for the belowground phenomenon are effectively controlled by implementing any of the known techniques. On the other hand, the component H causing the oversupply phenomena and for which no measures are implemented, will be a safe distance from the circuits C. A similar arrangement is made by interposing the component H, for which techniques to contrast the conditions leading to the oversupply phenomenon are implemented, between the component L and the sensitive circuits C, will be alternatively used.

The principle of the invention is to ensure that only one of a dual pair of components L or H is in proximity of the sensitive circuits C. Suitable protection techniques for the specific phenomenon arising in the components L or H physically close to the circuits C may be implemented without making the phenomena worse. Alternatively, between the critical power device L or H and the region containing the circuits C to be protected, other devices may be interposed. Also, where possible in terms of available integration area, a dummy n region is biased at an arbitrary constant voltage.

To this end, it is possible to form L or U shaped structures, or even ring shaped structures to accentuate where necessary and/or feasible, the shielding effect of the region interposed between the C region containing the particularly sensitive circuits or integrated structures and the region containing the DMOS power device L or H. This later region does not have any contrasting measures implemented against the belowground or oversupply phenomena.

BRIEF DESCRIPTION OF THE DRAWING

FIGS. 4 to 8 show effective layouts, according to the present invention.

DETAILED DESCRIPTION OF THE PREFERRED EMBODIMENTS

Figure 2:
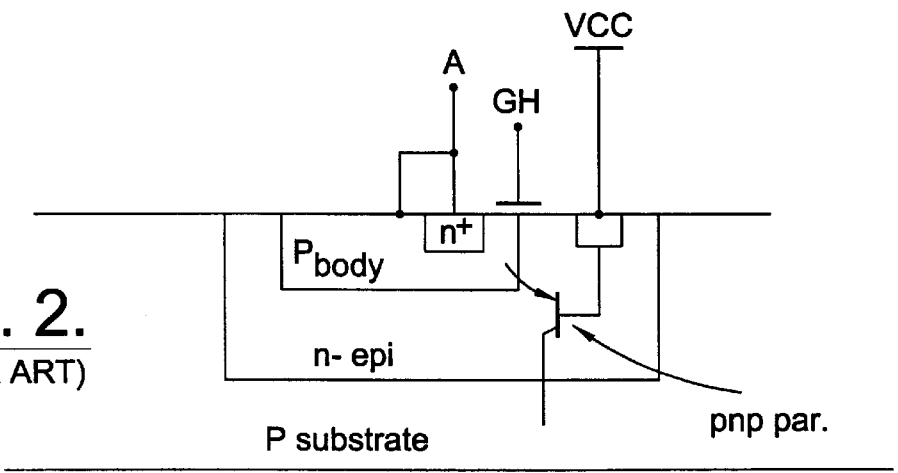
FIG. 2 illustrates how the so-called oversupply phenomenon may occur, according to the prior art.
Figure 3:
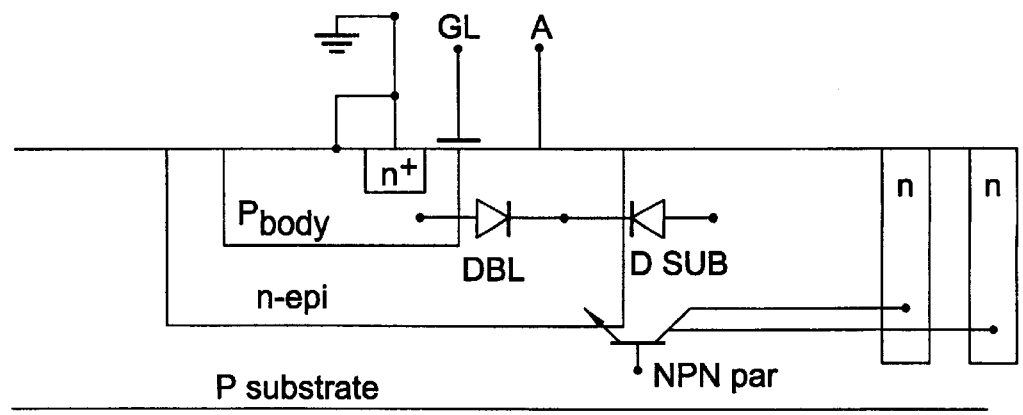
FIG. 3 illustrates how the so-called belowground phenomenon may occur, according to the prior art.

In FIGS. 4 to 8, H and L indicate the areas defined in the layout of the integrated circuit coinciding with regions of the epitaxial layer containing a p-channel and an n-channel DMOS transistor, respectively, at the output stage of the integrated circuit. In our example, these regions may be diffused n-regions, n-epi or n-well regions formed on a p substrate. These regions respectively contain the high side driver switch (H) and the low side driver switch (L) of an output power stage, as the one illustrated in FIG. 1. This is in accordance with the respective integrated structures shown in FIGS. 2 and 3. The letter C identifies a region of the epitaxial layer or of a separate well region containing an integrated circuit. This region C has component structures that must be protected from the oversupply and/or the belowground phenomena occurring respectively in the DMOS transistors H and L.

Figure 1:
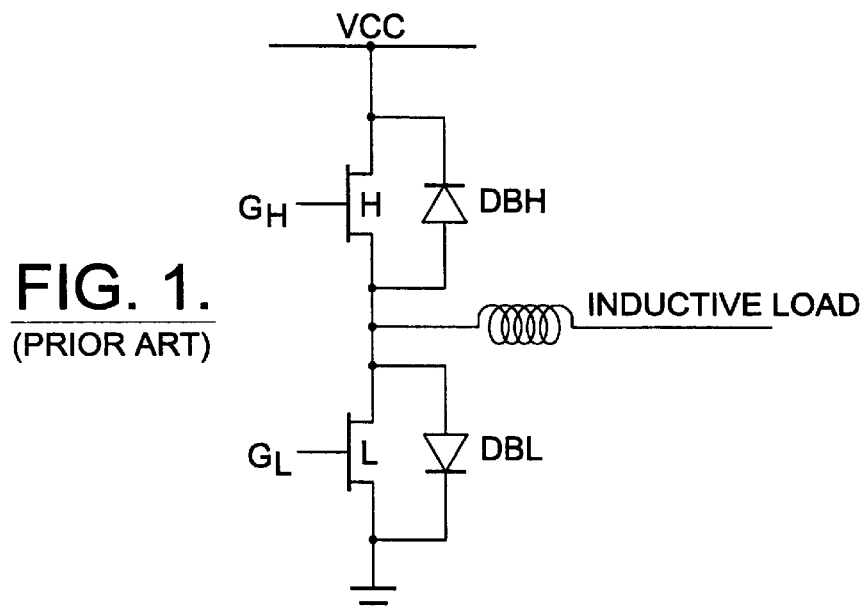
FIG. 1 illustrates a typical scheme of a switching circuit using DMOS power transistors, according to the prior art.

Referring to the layout of FIG. 4, it is assumed that dedicated circuits are used to control/limit the belowground phenomenon attributable to the lower switch L. The lower switch L is formed by the DMOS transistor L connected to ground, as shown in FIG. 1. During operation of the integrated circuit, position of the dedicated circuits in the layout of the integrated circuit will be between the C region containing the circuitry sensitive to the belowground and the oversupply phenomena, and the region containing the DMOS structure of the high side driver switch H. The oversupply phenomenon of the high side driver switch H will be tolerated by the circuits C due to the relatively large distance between the two regions.

Alternatively, if the integrated circuit includes dedicated circuitry designed to control and limit the oversupply phenomenon that may arise in the DMOS transistor H connected to the Vcc supply rail, the relative position of the H and L regions of the scheme illustrated in FIG. 4 will be inverted with respect to the location of the C region containing the sensitive circuitry.

The shielding effect is obtained by interposing between the C region containing the sensitive circuits and the region containing the DMOS transistor, for which there are no means for contrasting the insurgence of either a belowground or oversupply phenomenon, the region of the complementary DMOS transistor. The complementary DMOS transistor controls and limits the respective phenomenon present, and may be accentuated or adapted to layout requirements of a particular integrated circuit even by deliberately conforming in a L, U or ring shape the respective region, as shown by way of an example in FIGS. 5 and 6.

Figure 7:
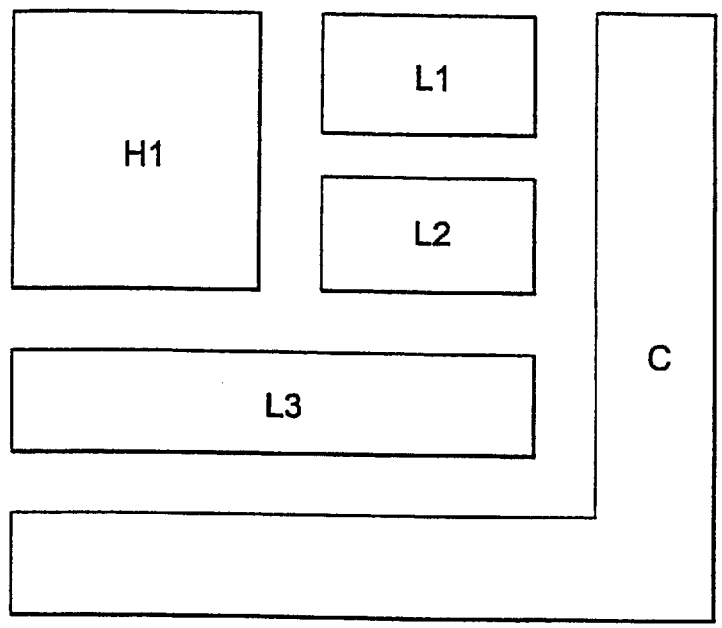

FIG. 7 shows an embodiment of the invention wherein more than one DMOS transistor L1, L2 and L3 are connected to ground. The isolated regions are formed between a region containing a DMOS transistor H1 connected to the supply rail, and a C region containing circuits particularly sensitive to the effects of oversupply.

Figure 8:
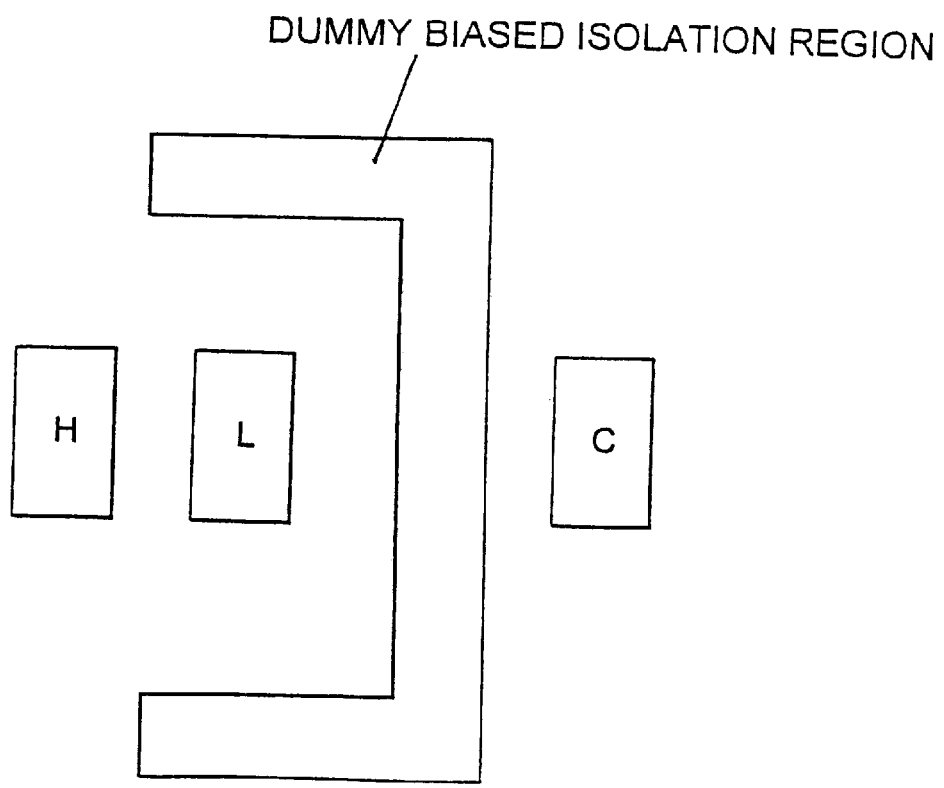

Referring now to FIG. 8, an alternative embodiment of the invention may also include forming an isolated region, for example, an n region for the example considered, having the only function of shielding a region containing sensitive circuits from a region containing a DMOS transistor which may induce an oversupply or a belowground phenomenon.

What is claimed is:

1. An integrated circuit with junction isolation comprising:
   a substrate having a first conductivity type;
   at least one first and at least one second DMOS power transistors formed in respective first and second regions of a second conductivity type on said substrate, said at least one first DMOS power transistor being connected to a voltage supply and said at least one second DMOS power transistor being connected to ground;
   at least one circuit formed in a third region on said substrate, said at least one circuit being sensitive to oversupply and belowground effects induced by said at least one first and at least one second DMOS power transistors; and
   a belowground protection circuit for controlling the belowground effects induced by said at least one second DMOS power transistor;
   the second region being interposed between the third region and the first region and having a predetermined shape so that the oversupply effects induced by said at least one first DMOS power transistor in the first region to said at least one circuit in the third region are attenuated by a layout separation resulting from the predetermined shape of the interposed second region.

2. An integrated circuit according to claim 1, wherein said at least one first DMOS power transistor does not include an oversupply protection circuit associated therewith for controlling the oversupply effects.

3. An integrated circuit according to claim 1, wherein the first and second regions comprise respective wells formed on said substrate.

4. An integrated circuit according to claim 1, wherein the first and second regions comprise respective doped portions of an epitaxial layer.

5. An integrated circuit according to claim 4, wherein said epitaxial layer comprises an n-type material and said substrate comprises a p-type material.

6. An integrated circuit according to claim 1, wherein the predetermined shape of the second region is L-shaped.

7. An integrated circuit according to claim 1, wherein the predetermined shape of the second region is U-shaped.

8. An integrated circuit according to claim 1, wherein the predetermined shape of the second region is ring-shaped.

9. An integrated circuit with junction isolation comprising:
   a substrate having a first conductivity type;
   at least one first and at least one second DMOS power transistors formed in respective first and second regions of a second conductivity type on said substrate, said at least one first DMOS power transistor being connected to a voltage supply and said at least one second DMOS power transistor being connected to ground;
   at least one circuit formed in a third region on said substrate, said at least one circuit being sensitive to oversupply and belowground effects induced by said at least one first and at least one second DMOS power transistors; and
   an oversupply protection circuit for controlling the oversupply effects induced by said at least one first DMOS power transistor;
   the first region being interposed between the third region and the second region and having a predetermined shape so that the belowground effects induced by said at least one second DMOS power transistor in the second region are attenuated by a layout separation resulting from the predetermined shape of the interposed first region.

10. An integrated circuit according to claim 9, wherein said at least one second DMOS power transistor does not have a belowground protection circuit associated therewith for controlling the belowground effects.

11. An integrated circuit according to claim 9, wherein the first and second regions comprise respective well regions formed on said substrate.

12. An integrated circuit according to claim 9, wherein the first and second regions comprise respective doped portions of an epitaxial layer.

13. An integrated circuit according to claim 12, wherein said epitaxial layer comprises an n-type material and said substrate comprises a p-type material.

14. An integrated circuit according to claim 9, wherein the predetermined shape of the first region is L-shaped.

15. An integrated circuit according to claim 9, wherein the predetermined shape of the first region is U-shaped.

16. An integrated circuit according to claim 9, wherein the predetermined shape of the first region is ring-shaped.

17. An integrated circuit with junction isolation comprising:

a substrate having a first conductivity type;

at least one first and at least one second DMOS power transistors formed in respective first and second regions of a second conductivity type on said substrate, said at least one first DMOS power transistor being connected to a voltage supply and said at least one second DMOS power transistor being connected to ground;

at least one circuit formed in a third region on said substrate, said at least one circuit being sensitive to oversupply and belowground effects induced by said at least one first and at least one second DMOS power transistor; and a dummy biased isolation region on said substrate being interposed between the third region and the first and second regions and having a predetermined shape so that the oversupply and belowground effects induced by said at least one first and at least one second DMOS power transistors to said at least one circuit are attenuated by a layout separation resulting from the predetermined shape of the interposed dummy biased isolation region.

18. An integrated circuit according to claim 17, wherein said at least one first DMOS power transistor is closer to said dummy biased isolation region, said at least one first DMOS power transistor does not include an oversupply protection circuit associated therewith for controlling the oversupply effects.

19. An integrated circuit according to claim 17, wherein said at least one second DMOS power transistor is closer to said dummy biased isolation region, said at least one second DMOS power transistor does not include a belowground protection circuit associated therewith for controlling the belowground effects.

20. An integrated circuit according to claim 17, wherein the first and second regions comprise respective well regions formed on said substrate.

21. An integrated circuit according to claim 17, wherein the first and second regions comprise respective doped portions of an epitaxial layer.

22. An integrated circuit according to claim 21, wherein said epitaxial layer comprises an n-type material and said substrate comprises a p-type material.

23. An integrated circuit according to claim 17, wherein the dummy biased isolation region has the second conductivity type.

* * * * *